(12) United States Patent
Koiwa

(10) Patent No.: US 7,511,325 B2
(45) Date of Patent: Mar. 31, 2009

(54) FERROELECTRIC CAPACITOR

(75) Inventor: Ichiro Koiwa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 10/820,770

(22) Filed: Apr. 9, 2004

(65) Prior Publication Data

US 2004/0201050 A1   Oct. 14, 2004

(30) Foreign Application Priority Data

Apr. 10, 2003   (JP) .............................. 2003-106601

(51) Int. Cl.
*H01L 27/108* (2006.01)

(52) U.S. Cl. .............. 257/309; 438/239; 257/E27.048; 257/E21.664

(58) Field of Classification Search ............ 257/295, 257/296, 308, 309, 532, 534, 524, E21.664, 257/E27.048; 438/240, 255
See application file for complete search history.

(56) References Cited

U.S. PATENT DOCUMENTS

| | | | | |
|---|---|---|---|---|
| 5,679,596 A | * | 10/1997 | Lu | 438/396 |
| 6,033,953 A | * | 3/2000 | Aoki et al. | 438/255 |
| 6,284,595 B1 | * | 9/2001 | Kato | 438/253 |

FOREIGN PATENT DOCUMENTS

| | | |
|---|---|---|
| JP | 05-082802 | 4/1993 |
| JP | 07-074324 | 3/1995 |
| JP | 2000208646 | 7/2000 |
| JP | 2001-156263 | 6/2001 |

* cited by examiner

*Primary Examiner*—Quoc D Hoang
(74) *Attorney, Agent, or Firm*—Volentine & Whitt, P.L.L.C.

(57) ABSTRACT

A ferroelectric capacitor includes a bottom electrode, a ferroelectric layer formed on the bottom electrode, and a top electrode formed on the ferroelectric layer. A plurality of projection electrodes are formed on the bottom electrode.

14 Claims, 13 Drawing Sheets

FERROELECTRIC CAPACITOR

CROSS REFERENCE TO RELATED APPLICATION

A claim of priority under 35 U.S.C. §119 is made to Japanese Patent Application No. 2003-106601, filed Apr. 10, 2003, which is herein incorporated by reference in its entirety for all purposes.

BACKGROUND OF THE INVENTION

1. Field of the Invention

The present invention relates to a ferroelectric capacitor.

2. Description of the Related Art

A ferroelectric memory is a kind of nonvolatile memory. A mechanism of polarization of the ferroelectric capacitor is described in a reference 1: "Ferroelectric thin film integration technology" Tadashi Shiosaki, Feb. 28, 1992, Science Forum Inc, pp. 205-213. Also, a device structure is described in a reference 2: Japanese Patent Laid-Open No. 5-82802 and a reference 3: Japanese Patent Laid-Open No. 2001-156263.

In a conventional ferroelectric memory, one terminal of a ferroelectric capacitor is connected to a drive line and the other terminal of the ferroelectric capacitor is connected to a bit line via a select transistor as described in reference 2. The polarized condition of the ferroelectric capacitor represents the data of a memory cell. For example, a condition that the ferroelectric capacitor is polarized positive can represent data of "1" and a condition that the ferroelectric capacitor is polarized negative can represent data of "0".

When the drive line is high level and the select transistor turns on, a voltage of the bit line changes responsive to the polarization condition of the ferroelectric capacitor. The voltage of the bit line is amplified by a sense amplifier and outputted.

The ferroelectric memory is a destructive read type memory. Therefore, a rewriting step is needed for every read step. The rewriting step is performed by supplying the amplified voltage to the bit line.

Recently, fast read ferroelectric memories are desired. The inventor has thus considered the causes of the read time of the ferroelectric memory being slow.

FIG. 1 is a plot showing a relationship between a delay time and a read margin. The delay time shows a time from when a read voltage is applied between each of the terminals of the ferroelectric capacitor, to when the sense amplifier is operated. The read margin is a voltage difference between a read voltage representing a data "1" as stored in the ferroelectric capacitor and a read voltage representing a data "0" as stored in the ferroelectric capacitor. A high level is shown by "1" and a low level is shown by "0". In FIG. 1, a vertical axis shows the read margin and a horizontal axis shows the delay time. FIG. 1 shows cases of read voltage of 2V, 3V and 3.6V.

For example, if a margin of 0.4V is needed, a delay time is 400 ns, 60 ns and 40 ns respectively for each read voltage 2V, 3V and 3.6V.

FIG. 2(A) to FIG. 2(C) are plots showing a relationship between a delay time and a voltage of the bit line. In FIG. 2(A) to FIG. 2(C), a vertical axis shows the voltage of the bit line and a horizontal axis shows the delay time. A lowest voltage from the memory cell which is stored as a "1" value and a highest voltage from the memory cell which is stored as a "0" value are shown in FIG. 2(A) to FIG. 2(C). FIG. 2(A) to FIG. 2(C) show a plot for writing voltage of 2V, 3V and 3.6V respectively.

If the stored data is "1", the read voltage is dependent largely on the time. If the stored data is "0", the read voltage is not dependent so much on the time. Data "1" is read with a polarization reversal and data "0" is read without the polarization reversal. That is, the delay time is dependent on the polarization reversal time.

FIG. 3(A) and FIG. 3(B) are plots showing a relationship between the delay time and the voltage of the bit line. FIG. 3(A) shows curves of data "0" of FIG. 2(A) to FIG. 2(C), and FIG. 3(B) shows curves of data "1" of FIG. 2(A) to FIG. 2(C).

If data is "0", the relationship between the delay time and the voltage of the bit line is not dependent on the read voltage. If data is "1", the relationship between the delay time and the voltage of the bit line is largely dependent on the read voltage. Therefore, using high read voltage is preferable for fast reading time of the ferroelectric capacitor.

However, using high voltage for reading the ferroelectric memory increases power consumption. If the voltage applied between each terminal of the ferroelectric capacitor is increased, field intensity at the ferroelectric capacitor is increased. As a result, reliability of the ferroelectric layer of the ferroelectric capacitor is decreased.

FIG. 4(A) to FIG. 4(C) are views showing a mechanism of the polarization of the ferroelectric capacitor. First, a voltage is applied with a bottom electrode 1201 and a top electrode 1203. Then, cores 1204 for inverting the polarization are generated in a ferroelectric layer 1202 as shown in FIG. 4(A). The cores 1204 are generated in a boundary face between the bottom electrode 1201 and the ferroelectric layer 1202 and a boundary face between the top electrode 1203 and the ferroelectric layer 1202. Then, the cores 1204 are extended to the other electrode as shown in FIG. 4(B). Then, the cores 1204 are extended in horizontal direction and combined with each other as shown in FIG. 4(C). As a result, the inversion of the polarization of the ferroelectric capacitor is completed.

In the polarization operation, an extending speed of the cores in a vertical direction is fast, and an extending speed of the cores in a horizontal direction is slow. Therefore, a time for the polarization operation is dependent largely on the extending time in the horizontal direction.

SUMMARY OF THE INVENTION

Accordingly, in one aspect of the present invention, a ferroelectric capacitor for reducing a reading time is provided. The ferroelectric capacitor includes a bottom electrode, a ferroelectric layer formed on the bottom electrode, and a top electrode formed on the ferroelectric layer. A plurality of projection electrodes are formed on the bottom electrode.

DETAILED DESCRIPTION OF THE PREFERRED EMBODIMENTS

Figure 1:
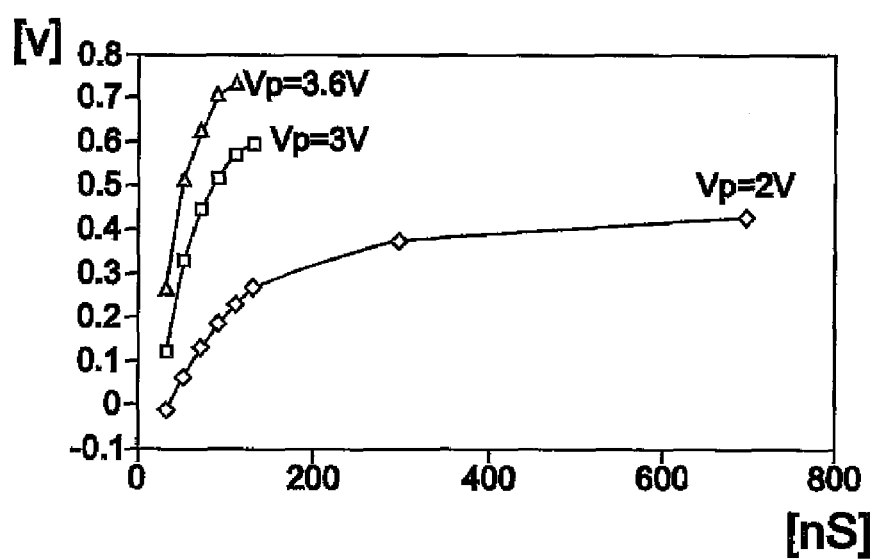
FIG. 1 is a plot showing a relationship between delay time and read margin in a conventional ferroelectric memory.
Figure 2A:
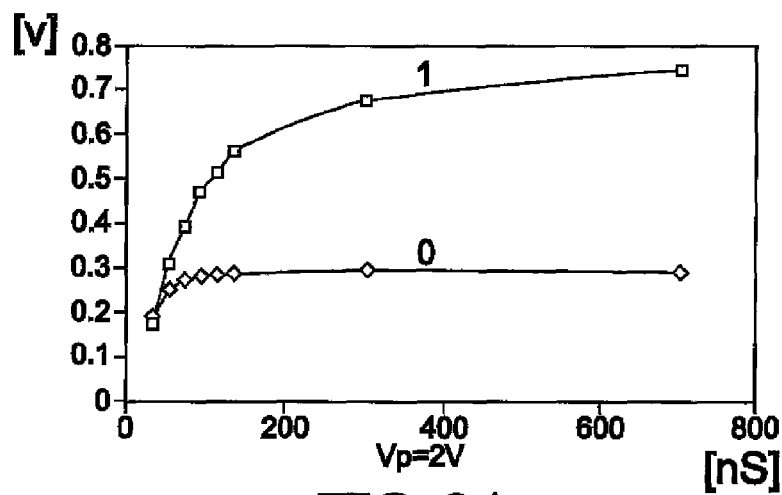
FIG. 2(A) to FIG. 2(C) are plots showing a relationship between delay time and a voltage of the bit line in the conventional ferroelectric memory.
Figure 2B:
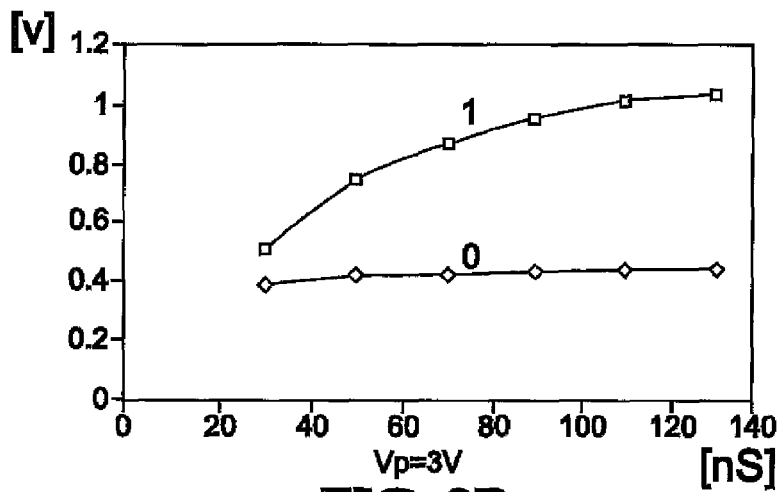
Figure 2C:
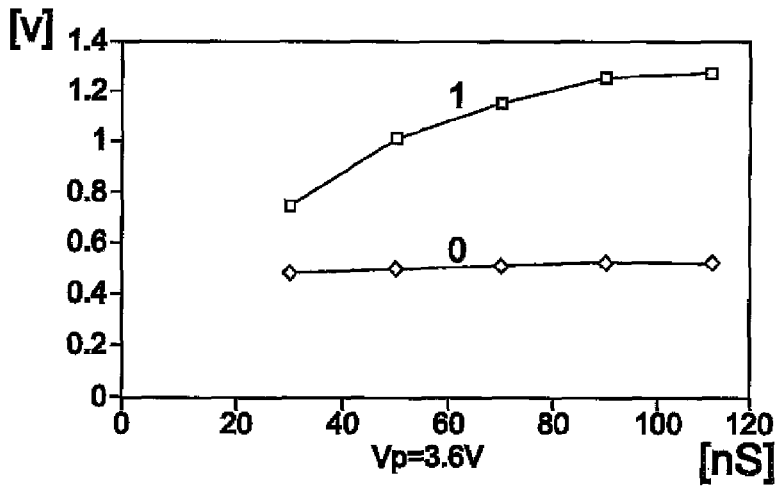
Figure 3A:
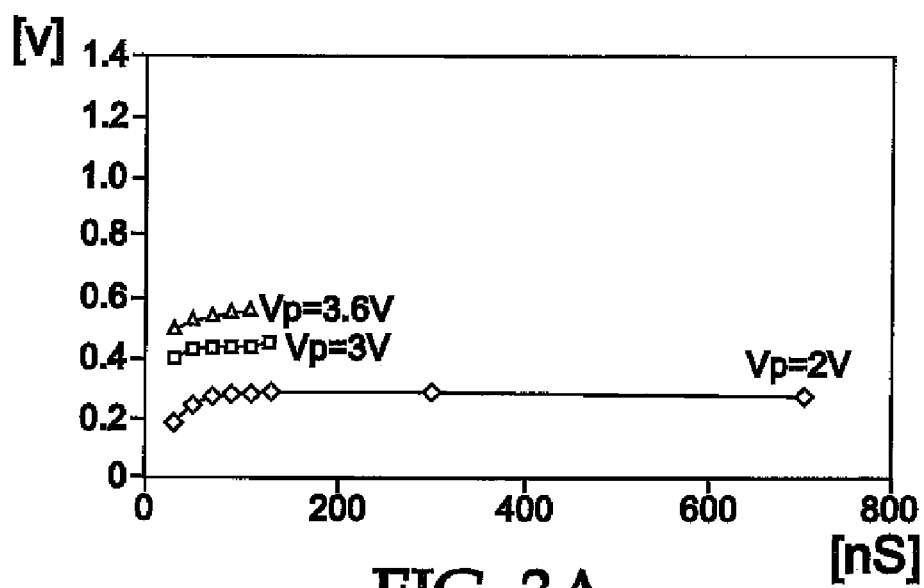
FIG. 3(A) and FIG. 3(B) are plots showing a relationship between delay time and the voltage of the bit line in the conventional ferroelectric memory.
Figure 3B:
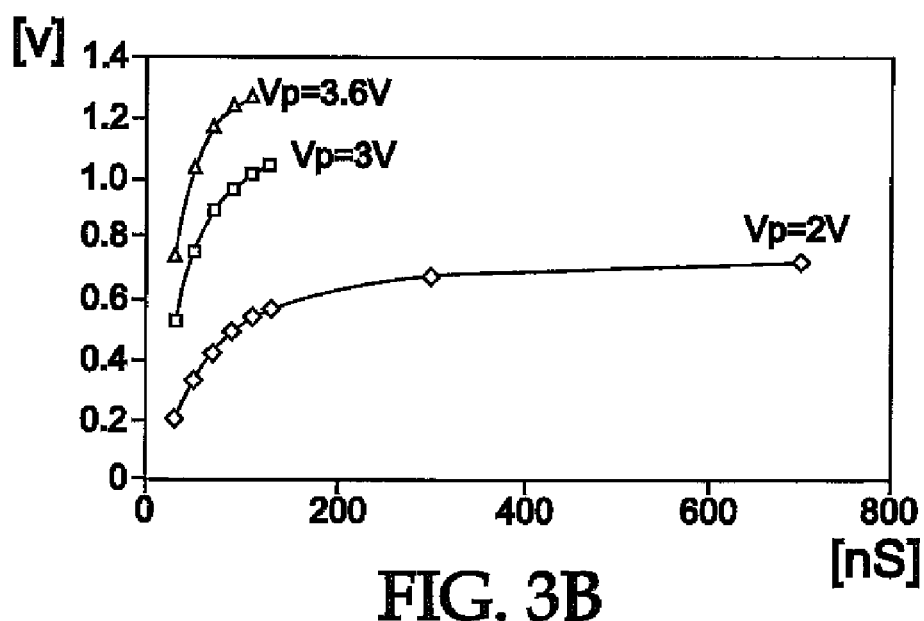
Figure 4A:
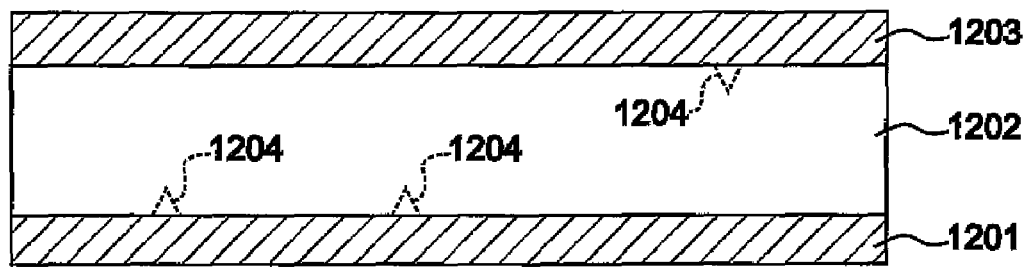
FIG. 4(A) to FIG. 4(C) are views showing a mechanism of the polarization of the ferroelectric capacitor in the conventional ferroelectric memory.
Figure 4B:
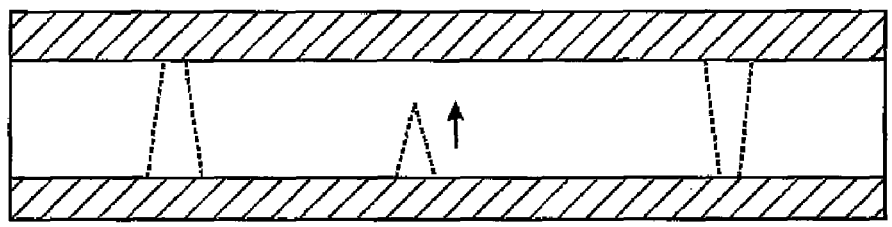
Figure 4C:
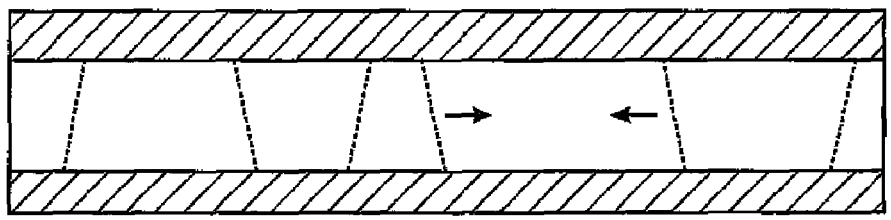

A ferroelectric capacitor according to preferred embodiments of the present invention will be explained hereinafter with reference to the accompanying Figures. In order to simplify the explanation, like elements are given like or corresponding reference numerals. Dual explanations of the same elements are avoided.

Figure 5:
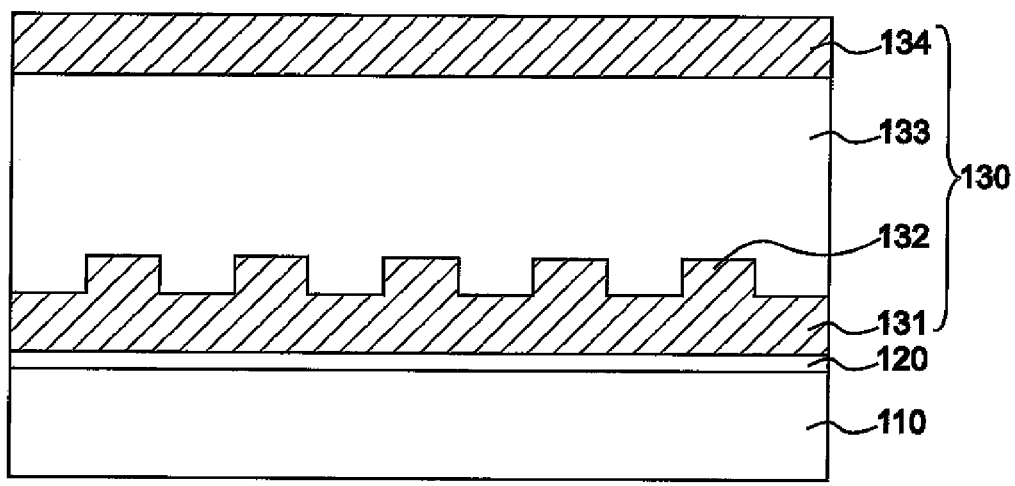
FIG. 5 is a cross-sectional view showing a ferroelectric capacitor of a first embodiment of the present invention.
Figure 6A:
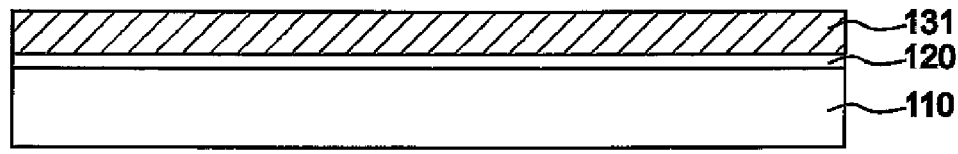
FIG. 6(A) to FIG. 6(D) are views showing manufacturing steps for the ferroelectric capacitor of the first embodiment of the present invention.
Figure 6B:
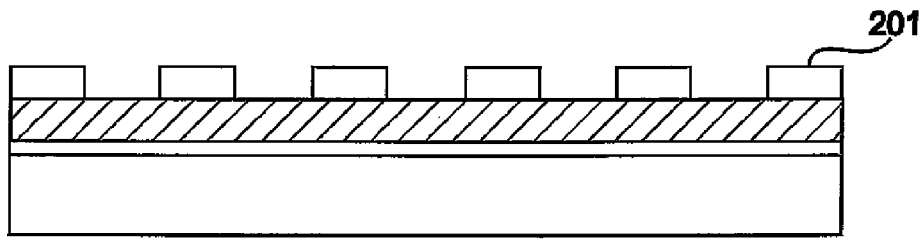
Figure 6C:
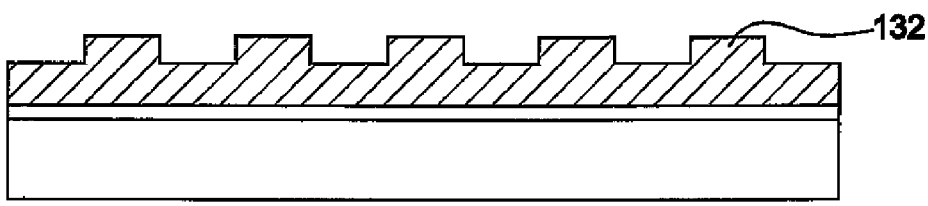
Figure 6D:
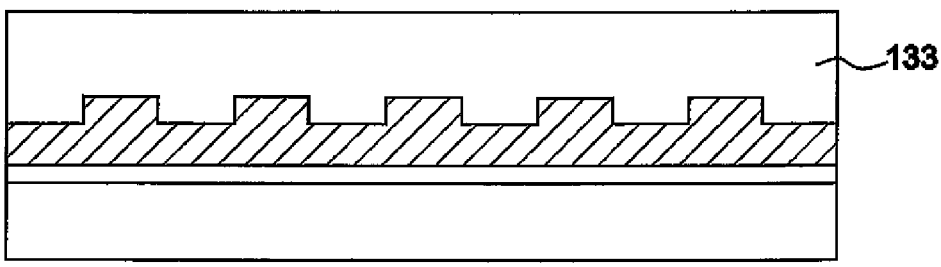
Figure 7:
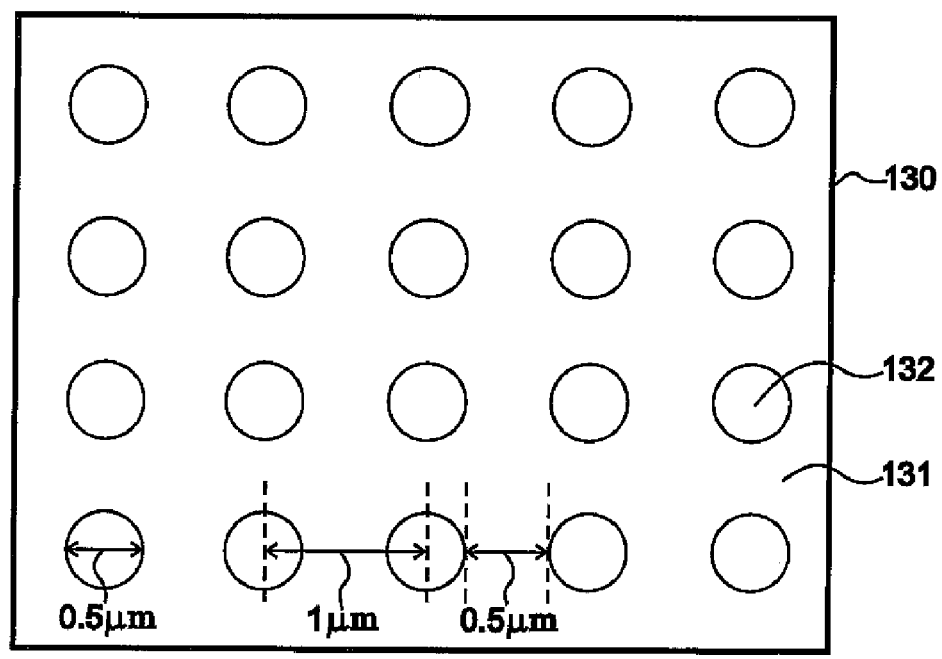
FIG. 7 is a plan view showing the ferroelectric capacitor of the first embodiment of the present invention.

A ferroelectric memory device 100 is described by referring to FIG. 5 to FIG. 7. FIG. 5 is a cross-sectional view showing a ferroelectric capacitor 130 of a first embodiment of the present invention. A silicon dioxide layer 120 is formed on a semiconductor substrate 110 and the ferroelectric capacitor 130 is formed on the silicon dioxide layer 120 as shown in FIG. 5. The ferroelectric capacitor 130 includes a bottom electrode 131, a plurality of projection electrodes 132 on the bottom electrode layer 131, a ferroelectric layer 133 formed on the bottom electrode layer 131, and a top electrode layer 134 formed on the ferroelectric layer 133.

The bottom electrode layer 131, the projection electrodes 132 and the top electrode layer 134 are made of platinum or iridium. Also, platinum alloy or iridium alloy can be used. Further, a laminated structure of $IrO_2/Ir$ or $Pt/IrO_2/Ir$ can be used.

The ferroelectric layer 133 is made of $SrBi_2Ta_2O_9$, $PbZr_xTi_{1-x}(0 \leq x \leq 1)$, $PbTiO_3$ or $Bi_4Ti_3O_{12}$. A range from 5% to 20% of Ta in the $SrBi_2Ta_2O_9$ can be changed to Nb.

Next, a method of fabricating the ferroelectric capacitor 130 is described by referring to FIG. 6(A) to FIG. 6(D).

Initially, the silicon dioxide layer 120 is formed on the silicon substrate 110 by using a plasma TEOS technique as shown in FIG. 6(A). A thickness of the silicon dioxide layer 120 is 200 nm.

Then, the bottom electrode layer 131 such as platinum is formed on the silicon dioxide layer 120 by a sputtering technique as shown in FIG. 6(A). A thickness of the bottom electrode layer 131 is 200 nm.

Then, a resist pattern 201 is formed on the bottom electrode layer 131 by using a photolithography technique as shown in FIG. 6(B).

Then, platinum is deposited on the entire surface of the bottom electrode layer 131 including the resist pattern 201. Then, the resist pattern 201 is removed, including the platinum portion which is formed on the resist pattern 201. As a result, the projection electrodes 132 are formed by the platinum that remains, as shown in FIG. 6(C). A thickness of the projection electrodes 132 is 10% of a thickness of the ferroelectric layer 133.

FIG. 7 is a plan view showing a layout of the projection electrodes 132. The ferroelectric capacitor 130 has a size of 5 μm by 4 μm. Each of the projection electrodes 132 has a size of 0.5 μm in diameter. Each space between the projection electrodes 132 is 0.5 μm. Each distance between centers of the projection electrodes 132 is 1 μm.

For generating the polarization evenly in the ferroelectric capacitor 110, it is preferred that the projection electrodes 132 are arranged evenly on a surface of the bottom electrode layer 131.

If the projection electrodes 132 are arranged with too high a density, the polarization might not be generated evenly. Therefore, each space between the projection electrodes 132 should have a size of a range from 5% to 10% of the size of the ferroelectric capacitor 130, a size of the projection electrodes 132 should have a range from 5% to 10% of the size of the ferroelectric capacitor 130, and a distance between the center of the projection electrodes 132 should be in a range from 10% to 20% of the size of the ferroelectric capacitor 130.

Then, a ferroelectric material is formed on the bottom electrode layer 131 and the projection electrodes 132 by a spin coating technique. Then, the ferroelectric material is annealed in an oxygen atmosphere at 700° C. for 60 minutes. As a result, the ferroelectric layer 133 is formed as shown in FIG. 6(D). A thickness of the ferroelectric layer 133 is 120 nm.

Then, the top electrode layer 134 is formed by sputtering platinum on the ferroelectric layer as shown in FIG. 5. A thickness of the ferroelectric layer 134 is 200 nm.

Figure 8:
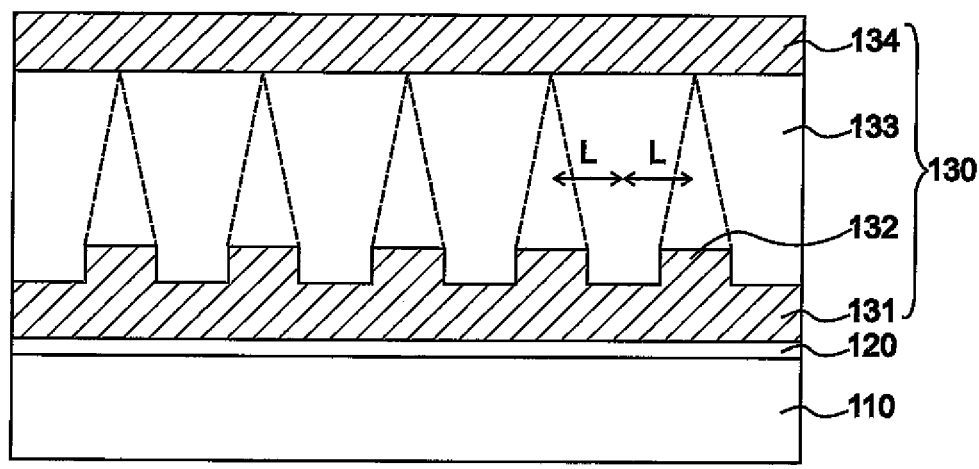
FIG. 8 is a cross-sectional view showing the ferroelectric capacitor of the first embodiment of the present invention.

Next, an explanation of how the ferroelectric memory device operates is described by referring to FIG. 8.

A thickness of the ferroelectric layer which is located on the projection electrodes 132 is thinner than a thickness of the ferroelectric layer which is located on the non-projection areas of the first electrode layer 131. Therefore, electric field intensity between the projection electrodes 132 and the top electrode 134 is stronger than electric field intensity between the non-projection areas of the bottom electrode layer 131 and the top electrode 134. As a result, cores for inverting the polarization are generated between the projection electrodes 131 and the top electrode 134. Accordingly, since the projection electrodes 132 are arranged evenly with short distance between each other, the cores for inverting the polarization are generated evenly with short distance between each other. Since the distance between the cores for inverting the polarization is short, an extending width for inverting the polarization in the horizontal direction can be reduced as shown by reference symbol "L" in FIG. 8. As a result, a time for inverting the polarization is reduced.

Next, a method of manufacturing a ferroelectric memory device of a second preferred embodiment is described by referring to FIG. 9(A) to FIG. 9(D).

Figure 9A:
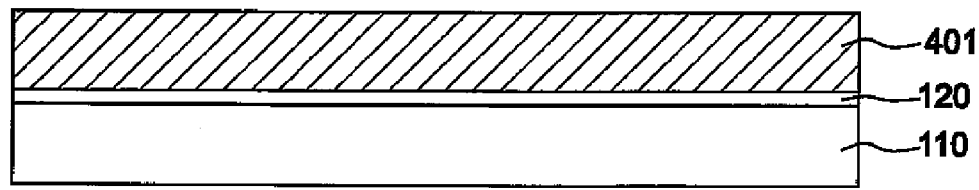
FIG. 9(A) to FIG. 9(D) are views showing manufacturing steps for a ferroelectric capacitor of a second embodiment of the present invention.

First, the silicon dioxide layer 120 is formed on the silicon substrate 110 by using a plasma TEOS technique as shown in FIG. 9(A). A thickness of the silicon dioxide layer 120 is 200 nm.

Then, a bottom electrode layer 401 is formed on the silicon dioxide layer 120 by using an RF sputtering technique as shown in FIG. 9(A). The material that is used as the bottom electrode layer 131 of the first embodiment can be used as the bottom electrode 401 of the second embodiment.

Figure 9B:
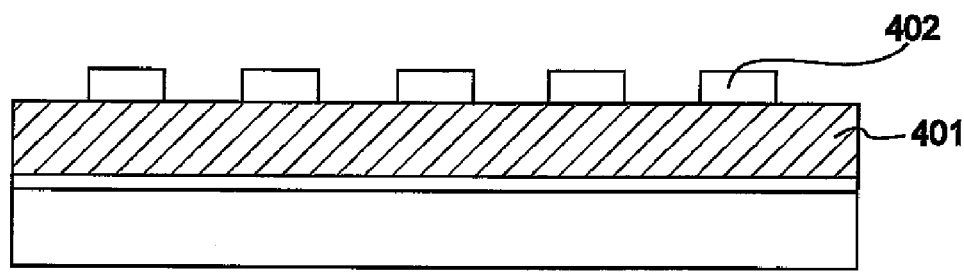

Then, a resist layer is formed on the bottom electrode layer 401. Then, the resist layer is patterned for making a resist pattern 402 as shown in FIG. 9(B).

Figure 9C:
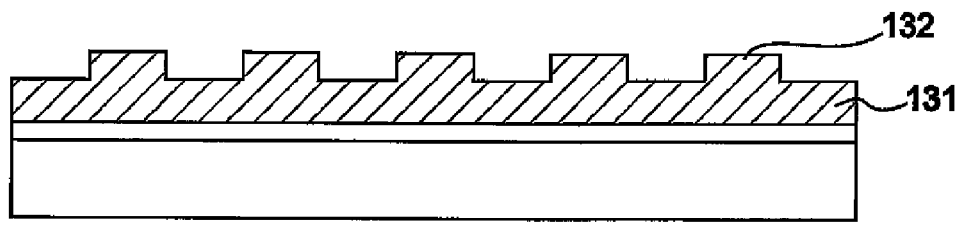

Then, the bottom electrode layer 401 is etched by using the resist pattern 402 as a mask. As a result, the projection electrodes 132 are formed under the resist pattern 402 and the remaining portion becomes the bottom electrode 131. The resist pattern 402 is removed after the etching as shown in FIG. 9(C). The etching step is performed by a dry etching technique. A thickness of the projection electrodes 132 and an arrangement of the projection electrodes 132 are the same as the thickness and the arrangement of the first embodiment.

Then, the ferroelectric layer 133 is formed on the bottom electrode 131 and the projection electrodes 132. A thickness of the ferroelectric layer 133 is 120 nm.

Figure 9D:
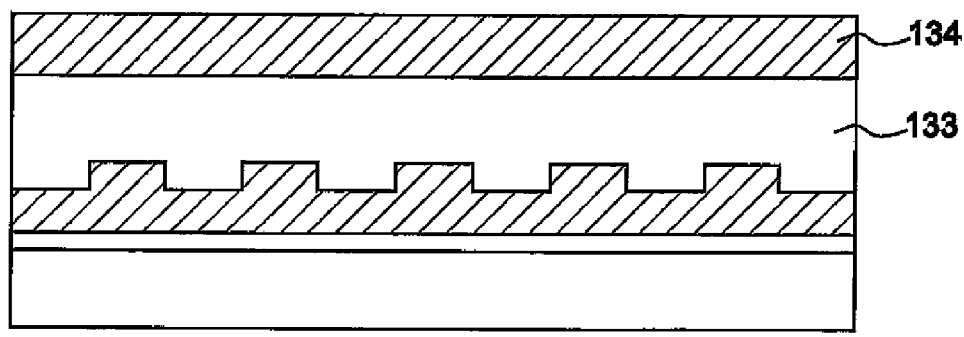

Then, the top electrode 134 is formed on the ferroelectric layer 133 as shown in FIG. 9(D). A thickness of the top electrode 134 is 200 nm.

According to the second embodiment, the projection electrodes 132 are formed by etching a surface of the bottom electrode layer 401.

Figure 10A:
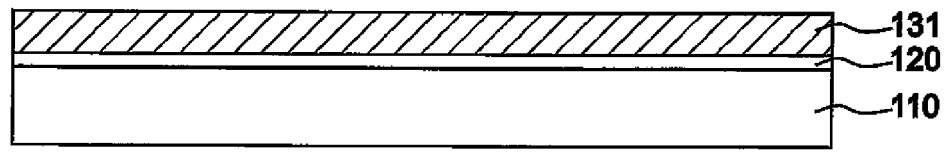
FIG. 10 (A) to FIG. 10(D) are views showing manufacturing steps for a ferroelectric capacitor of a third embodiment of the present invention.
Figure 10B:
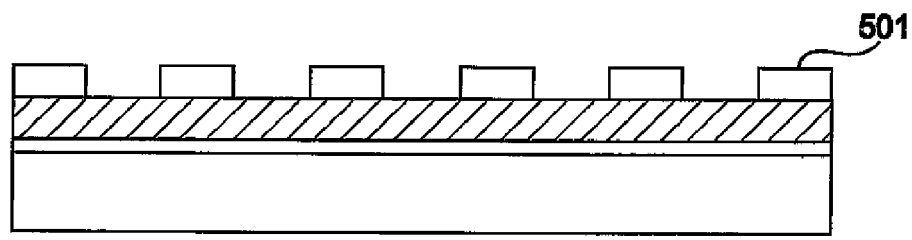
Figure 10C:
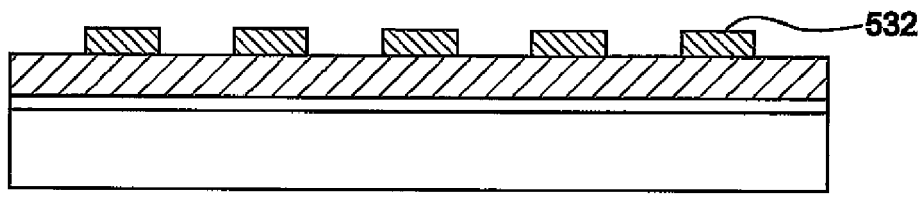
Figure 10D:
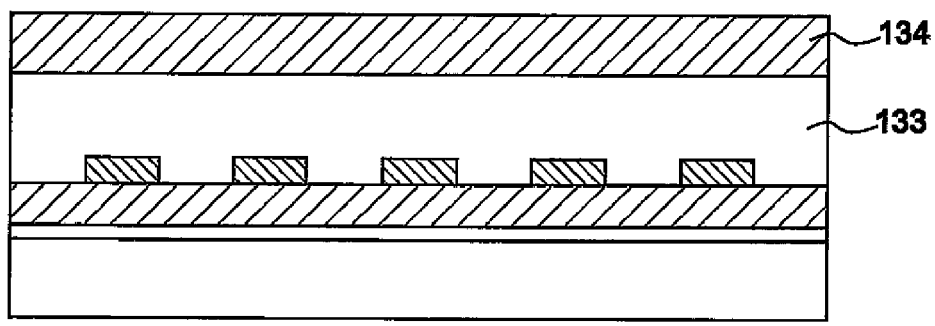

Next, a ferroelectric memory device of a third preferred embodiment is described by referring FIG. To 10(A) to FIG. 10(D).

First, the silicon dioxide layer 120 is formed on the silicon substrate 110 by using a plasma TEOS technique as shown in FIG. 10(A). A thickness of the silicon dioxide layer 120 is 200 nm.

Then, the bottom electrode layer 131 is formed on the silicon dioxide layer 120 by using an RF sputtering technique as shown in FIG. 10(A). The material that is used as the bottom electrode layer 131 of the first embodiment can be used as the bottom electrode 401 of the second embodiment.

Then, a resist layer is formed on the bottom electrode layer 131. Then, the resist layer is patterned for making a resist pattern 501 as shown in FIG. 10(B).

Then, bismuth is deposited on entire surface of the bottom electrode layer 131 including the resist pattern 501. Then, the resist pattern 501 is removed including the bismuth portion which is formed on the resist pattern 501. As a result, projection electrodes 532 made of bismuth are formed as shown in FIG. 10(C). A thickness of the projection electrodes 532 is 10% of the thickness of the ferroelectric layer 133.

Then, the ferroelectric layer 133 such as $SrBi_2Ta_2O_9$ is formed on the bottom electrode 131 and the projection electrodes 532. A thickness of the ferroelectric layer 133 is 120 nm.

Then, the top electrode 134 is formed on the ferroelectric layer 133 as shown in FIG. 10(D). A thickness of the top electrode 134 is 200 nm.

When the ferroelectric layer 133 is made of $SrBi_2Ta_2O_9$, the core for inverting the polarization is generated at a portion that a concentration of the bismuth is high. Also, bismuth alloy can be used as the projection electrodes 532.

When another material is used for the ferroelectric layer 133, a material that is included in the material of the ferroelectric layer 133 can be used as the material of the projection electrodes 532.

Figure 11A:
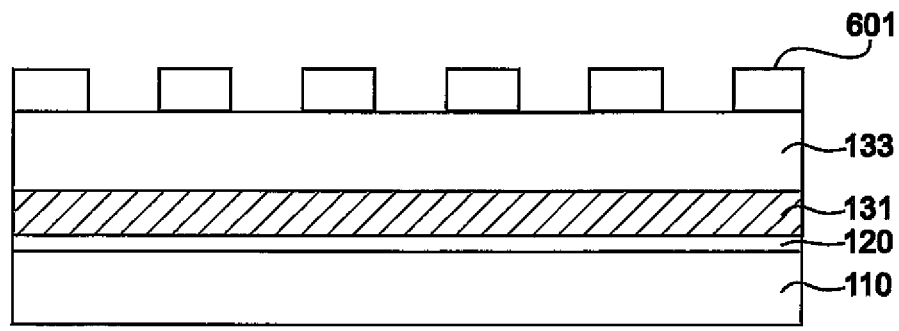
FIG. 11(A) to FIG. 11(C) are views showing manufacturing steps for a ferroelectric capacitor of a fourth embodiment of the present invention.
Figure 11B:
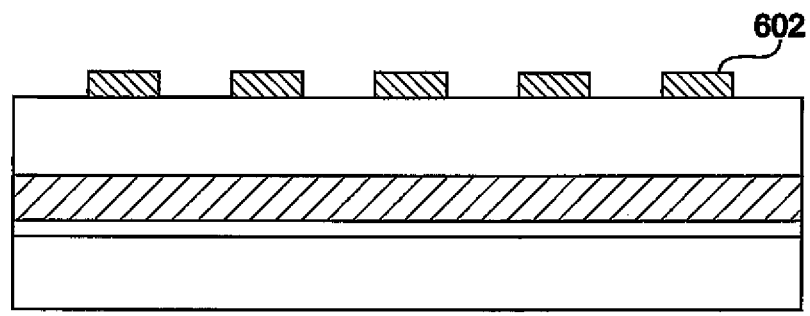
Figure 11C:
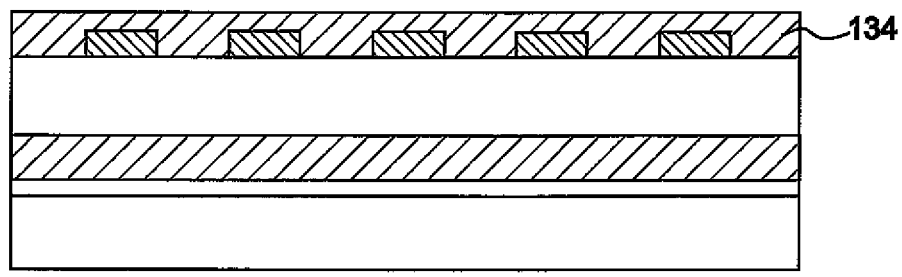

Next, a ferroelectric memory device of a fourth preferred embodiment is described by referring to FIG. 11(A) to FIG. 11(C).

First, the silicon dioxide layer 120 is formed on the silicon substrate 110 by using a plasma TEOS technique. A thickness of the silicon dioxide layer 120 is 200 nm. Then, the bottom electrode 131 is formed on the silicon dioxide layer 120.

Then, the ferroelectric layer 133 is formed on the bottom electrode 131. A top surface of the ferroelectric layer 133 is substantially flat.

Then, a resist layer is formed on the ferroelectric layer 133. A resist pattern 601 is formed by patterning the resist layer as shown in FIG. 11(A).

Then, bismuth is deposited on entire surface of the ferroelectric layer 133 including the resist pattern 601. Then, the resist pattern 601 is removed including the bismuth portion which is formed on the resist pattern 601. As a result, bismuth electrodes 602 are formed as shown in FIG. 11(B). A thickness of the projection electrodes 602 and an arrangement of the bismuth electrodes 602 are the same as the thickness and the arrangement of the projection electrodes 132 of the first embodiment.

Then, the top electrode 134 such as platinum is formed on the ferroelectric layer 133 and the bismuth electrodes 602 as shown in FIG. 11(C). The surfaces of the projection electrodes 602 and the surfaces of the top electrode 134 that are in contact with the ferroelectric layer 133 are substantially coplanar with respect to each other.

In this embodiment, the bismuth electrodes 602 which generate a core for inverting the polarization are embedded in the top electrode 134. When the ferroelectric layer 133 is made of $SrBi_2Ta_2O_9$, the core for inverting the polarization is generated at a portion that a concentration of the bismuth is high. Therefore, it is not necessary to project the bismuth electrodes 602 into the ferroelectric layer 133. Also, bismuth alloy can be used as the bismuth electrodes 602.

When another material is used for the ferroelectric layer 133, a material that is included in the material of the ferroelectric layer 133 can be used as the material of the bismuth electrodes 602.

Figure 12A:
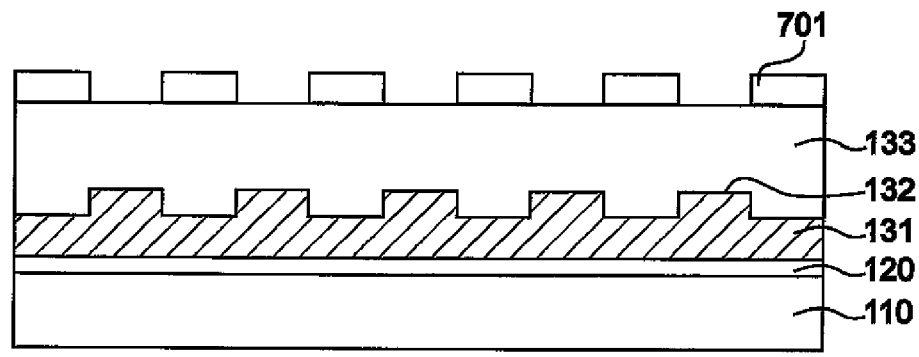
FIG. 12(A) to FIG. 12(C) are views showing manufacturing steps for a ferroelectric capacitor of a fifth embodiment of the present invention.
Figure 12B:
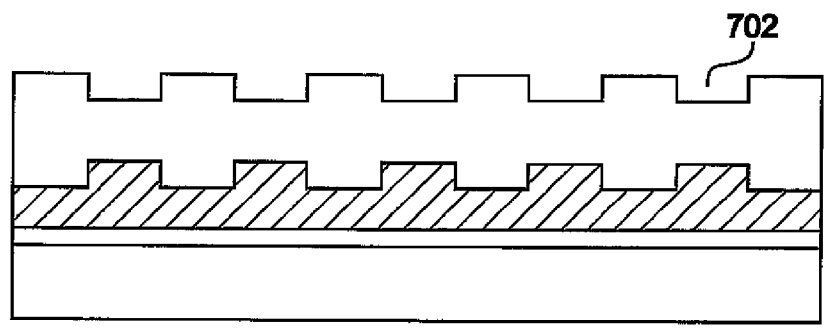
Figure 12C:
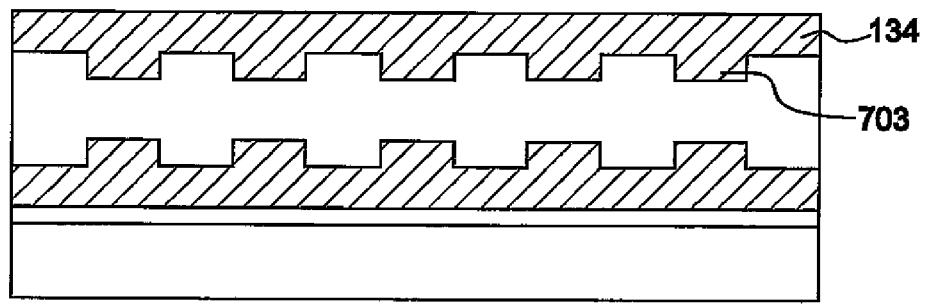

Next, a ferroelectric memory device of a fifth preferred embodiment is described by referring to FIG. 12(A) to FIG. 12(C).

First, the silicon dioxide layer 120, the bottom electrode layer 131, projection electrodes 132, and the ferroelectric layer 133 are formed on the semiconductor substrate as in the first embodiment.

Then, a resist layer is formed on the ferroelectric layer 133. Then, a resist pattern 701 is formed on the ferroelectric layer 133 by patterning the resist layer as shown in FIG. 12(A). The resist pattern 701 is arranged above a region that the projection electrode 132 is not formed.

Then, the ferroelectric layer 133 is etched by using the resist pattern 701 as a mask. As a result, grooves are formed on the ferroelectric layer 133. Then, the resist pattern 701 is removed as shown in FIG. 12(B).

Then, projection electrodes 703 and the top electrode 134 are formed on the ferroelectric layer 133 by depositing platinum as shown in FIG. 12(C). The projection electrodes 703 are arranged above the projection electrodes 132.

Figure 13A:
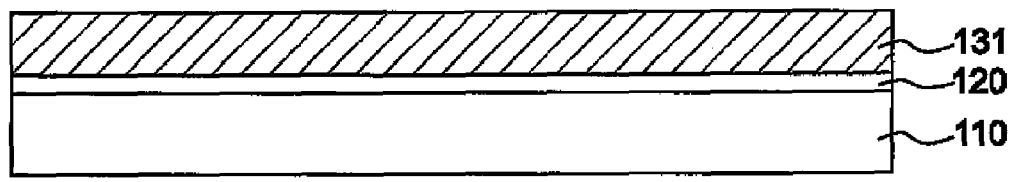
FIG. 13(A) to FIG. 13(C) are views showing manufacturing steps for a ferroelectric capacitor of a sixth embodiment of the present invention.
Figure 13B:
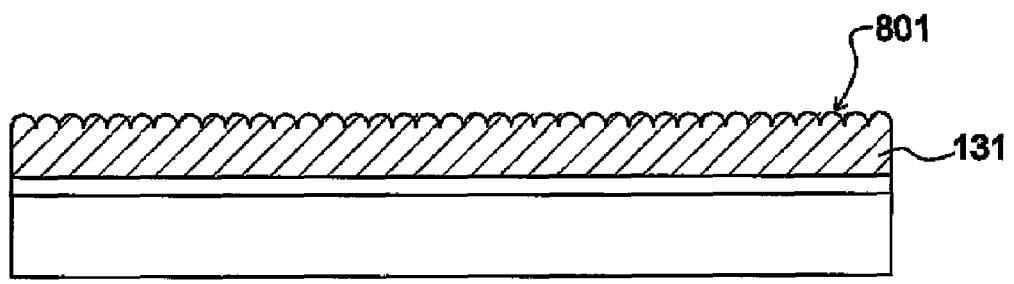
Figure 13C:
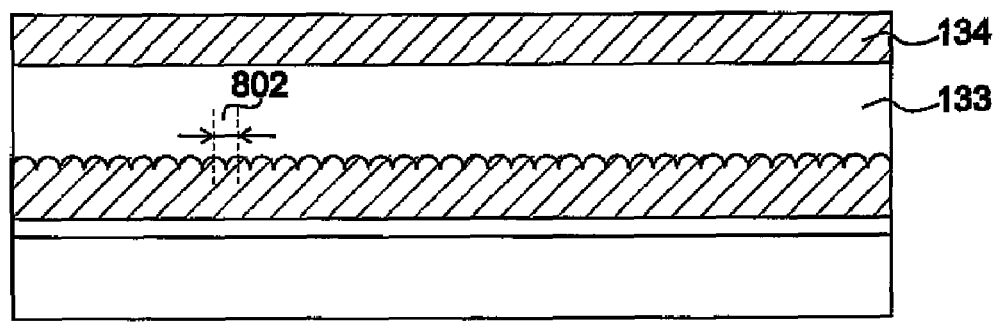

Next, a ferroelectric memory device of a sixth preferred embodiment is described by referring to FIG. 13(A) to FIG. 13(C).

First, the silicon dioxide layer 120 and the bottom electrode layer 131 are formed on the silicon substrate 110 as in the first embodiment, as shown in FIG. 13(A).

Then, a top surface of the bottom electrode 131 is roughened as shown in FIG. 13(B). The rough surface can be made by etching the surface of the bottom electrode 131 or crystallizing the bottom electrode 131 by heating. When the bottom electrode 131 is made of platinum, the surface can be roughened by heating at 750° C. for 30 minutes. A distance between tops 802 of the rough surface may be in a range from 300 nm to 500 nm.

Then, the ferroelectric layer 133 and the top electrode 134 are formed as in the first embodiment, as shown in FIG. 13(C).

While the preferred form of the present invention has been described, it is to be understood that modifications will be apparent to those skilled in the art without departing from the spirit of the invention. The scope of the invention is to be determined solely by the following claims.

What is claimed is:

1. A ferroelectric capacitor comprising:
    a stepped bottom electrode having a planar base electrode with a plurality of projection electrodes on the planar base electrode;
    a ferroelectric layer on the stepped bottom electrode; and
    a top planar electrode on the ferroelectric layer,
    wherein a thickness of the ferroelectric layer on the projection electrodes is less than a thickness of the ferroelectric layer on the planar base electrode,
    wherein spacing between central portions of each projection electrode has a range from 10% to 20% of a size of the ferroelectric capacitor, and
    wherein the top planar electrode comprises a plurality of second projection electrodes thereon, each of the plurality of second projection electrodes facing respective ones of the plurality of projection electrodes.

2. The ferroelectric capacitor of claim 1, wherein the projection electrodes are bismuth or bismuth alloy.

3. The ferroelectric capacitor of claim 2, wherein the planar base electrode is a metal which includes bismuth.

4. The ferroelectric capacitor of claim 1, wherein the planar base electrode and the projection electrodes are a same material.

5. A ferroelectric capacitor comprising:
    a stepped bottom electrode having a planar base electrode with a plurality of projection electrodes on the planar base electrode;
    a ferroelectric layer on the stepped bottom electrode; and
    a top planar electrode on the ferroelectric layer,
    wherein a thickness of the ferroelectric layer on the projection electrodes is less than a thickness of the ferroelectric layer on the planar base electrode,
    wherein a size of each projection electrode has a range from 5% to 10% of a size of the ferroelectric capacitor and
    wherein the top planar electrode comprises a plurality of second projection electrodes thereon, each of the plurality of second projection electrodes facing respective ones of the plurality of projection electrodes.

6. The ferroelectric capacitor of claim 5, wherein the projection electrodes are bismuth or bismuth alloy.

7. The ferroelectric capacitor of claim 6, wherein the planar base electrode is a metal which includes bismuth.

8. The ferroelectric capacitor of claim 5, wherein the planar base electrode and the projection electrodes are a same material.

9. A ferroelectric capacitor comprising:
    a stepped bottom electrode having a planar base electrode with a plurality of projection electrodes on the planar base electrode;
    a ferroelectric layer on the stepped bottom electrode; and
    a top planar electrode on the ferroelectric layer,
    wherein the projection electrodes are arranged spaced apart from each other evenly,
    wherein a thickness of the ferroelectric layer on the projection electrodes is less than a thickness of the ferroelectric layer on the planar base electrode, and cores of polarization inversion within the ferroelectric layer extend from the projection electrodes, and
    wherein the top planar electrode comprises a plurality of second projection electrodes thereon, each of the plurality of second projection electrodes facing respective ones of the plurality of projection electrodes.

10. The ferroelectric capacitor of claim 9, wherein the projection electrodes are bismuth or bismuth alloy.

11. The ferroelectric capacitor of claim 10, wherein the planar base electrode is a metal which includes bismuth.

12. The ferroelectric capacitor of claim 9, wherein the planar base electrode and the projection electrodes are a same material.

13. A ferroelectric capacitor comprising:
    a first stepped electrode comprising a first planar electrode having a plurality of projection electrodes on the first planar electrode and spaced apart from each other evenly;
    a second planar electrode; and
    a ferroelectric layer sandwiched between the first stepped electrode and the second planar electrode,
    wherein a thickness of the ferroelectric layer on the projection electrodes is less than a thickness of the ferroelectric layer on the first planar electrode, and cores of polarization inversion within the ferroelectric layer extend from the projection electrodes, and
    wherein the second planar electrode comprises a plurality of additional electrodes thereon, each of the additional electrodes facing respective ones of the projection electrodes.

14. The ferroelectric capacitor of claim 13, wherein the first planar electrode and the projection electrodes are a same material.

* * * * *